United States Patent
Shibata et al.

(10) Patent No.: US 10,693,186 B2
(45) Date of Patent: Jun. 23, 2020

(54) SOLID ELECTROLYTE CONTAINING OXYNITRIDE, AND SECONDARY BATTERY INCLUDING THE SOLID ELECTROLYTE

(71) Applicant: Panasonic Intellectual Property Management Co., Ltd., Osaka (JP)

(72) Inventors: Satoshi Shibata, Osaka (JP); Yu Nishitani, Osaka (JP); Takuji Tsujita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 16/100,586

(22) Filed: Aug. 10, 2018

(65) Prior Publication Data
US 2018/0351208 A1    Dec. 6, 2018

Related U.S. Application Data

(63) Continuation of application No. 15/371,063, filed on Dec. 6, 2016, now Pat. No. 10,074,872.

(30) Foreign Application Priority Data

Jul. 4, 2016   (JP) .................................. 2016-132614
Aug. 19, 2016  (JP) .................................. 2016-161513

(51) Int. Cl.
*H01M 10/0562* (2010.01)
*C23C 16/455* (2006.01)
(Continued)

(52) U.S. Cl.
CPC ....... *H01M 10/0562* (2013.01); *C23C 16/308* (2013.01); *C23C 16/45531* (2013.01); *C23C 16/45555* (2013.01); *H01M 10/054* (2013.01); *C23C 16/45561* (2013.01); *H01M 2300/0071* (2013.01)

(58) Field of Classification Search
None
See application file for complete search history.

(56) References Cited

U.S. PATENT DOCUMENTS 10,074,872 B2 *  9/2018  Shibata ............. C23C 16/45555
2007/0026309 A1  2/2007  Notten et al.
(Continued)

FOREIGN PATENT DOCUMENTS

JP    2001-076533 A    3/2001
JP    2007-506226 A    3/2007
(Continued)

OTHER PUBLICATIONS

The Extended European Search Report dated Jul. 27, 2017, for the related European Patent Application No. 16201664.6.
(Continued)

*Primary Examiner* — Christopher P Domone
(74) *Attorney, Agent, or Firm* — McDermott Will & Emery LLP

(57) ABSTRACT

A solid electrolyte includes an oxynitride that contains an alkaline-earth metal, phosphorus, oxygen, and nitrogen. A P2p spectrum obtained by an X-ray photoelectron spectroscopy measurement of the oxynitride contains a peak component originating from a P—N bond.

17 Claims, 10 Drawing Sheets

(51) Int. Cl.
*H01M 10/054* (2010.01)
*C23C 16/30* (2006.01)

(56) References Cited

U.S. PATENT DOCUMENTS

| | | |
|---|---|---|
| 2009/0159433 A1 | 6/2009 | Neudecker et al. |
| 2009/0162755 A1 | 6/2009 | Neudecker |
| 2016/0211520 A1 | 7/2016 | Takebayashi |

FOREIGN PATENT DOCUMENTS

| | | |
|---|---|---|
| JP | 2011-509502 A | 3/2011 |
| JP | 2011-511399 A | 4/2011 |
| JP | 2015-046350 A | 3/2015 |
| JP | 2015-103437 A | 6/2015 |
| WO | 2009/094524 A1 | 7/2009 |

OTHER PUBLICATIONS

Chen Ling et al., "First-principles study of the magnesiation of olivines: redox reaction mechanism, electrochemical and thermodynamic properties", J. Mater. Chem., 2012, 22, pp. 13517-13523, 2012.

Reidmeyer et al., "Preparation and Properties of Nitrogen-Doped Phosphate Glasses," Communications of the American Ceramic Society, 68 [8] C-188-C-190 (1985). (Year: 1985).

Podsiadlo, "Formation and Thermal Decomposition of Phosphorus Oxynitride Compounds of Magnesium," Journal of Thermal Analysis, vol. 34, 1217-1221 (1988), (Year: 1988).

B. Fleutot et al., Investigation of the local structure of LiPON thin films to better understand the role of nitrogen on their performance, Solid State Ionics, Feb. 26, 2011, vol. 186, pp. 29-36.

\* cited by examiner

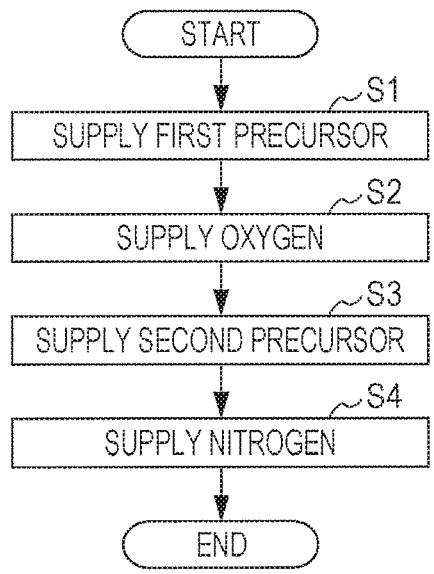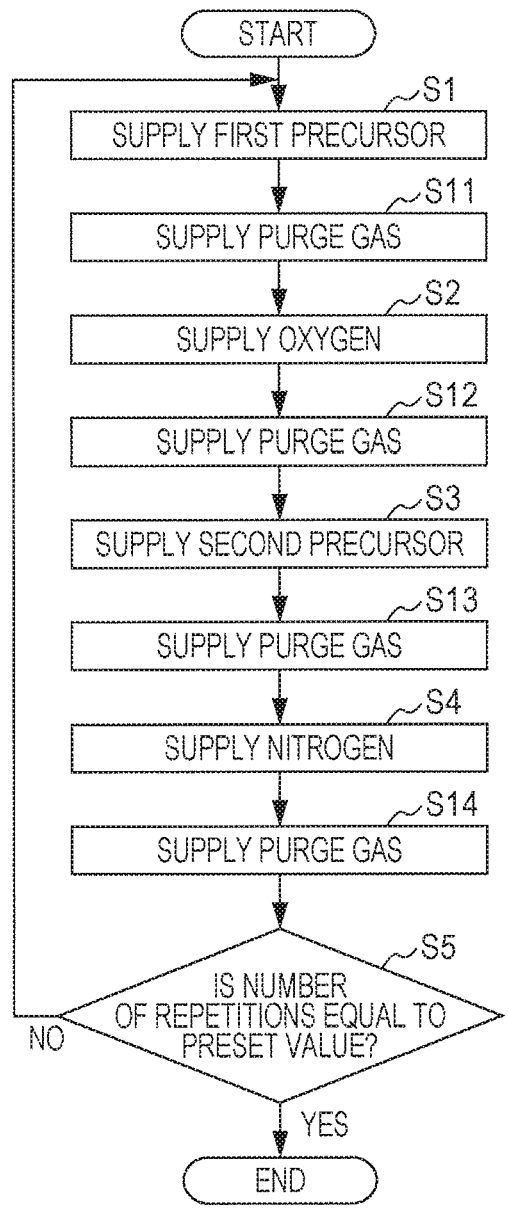

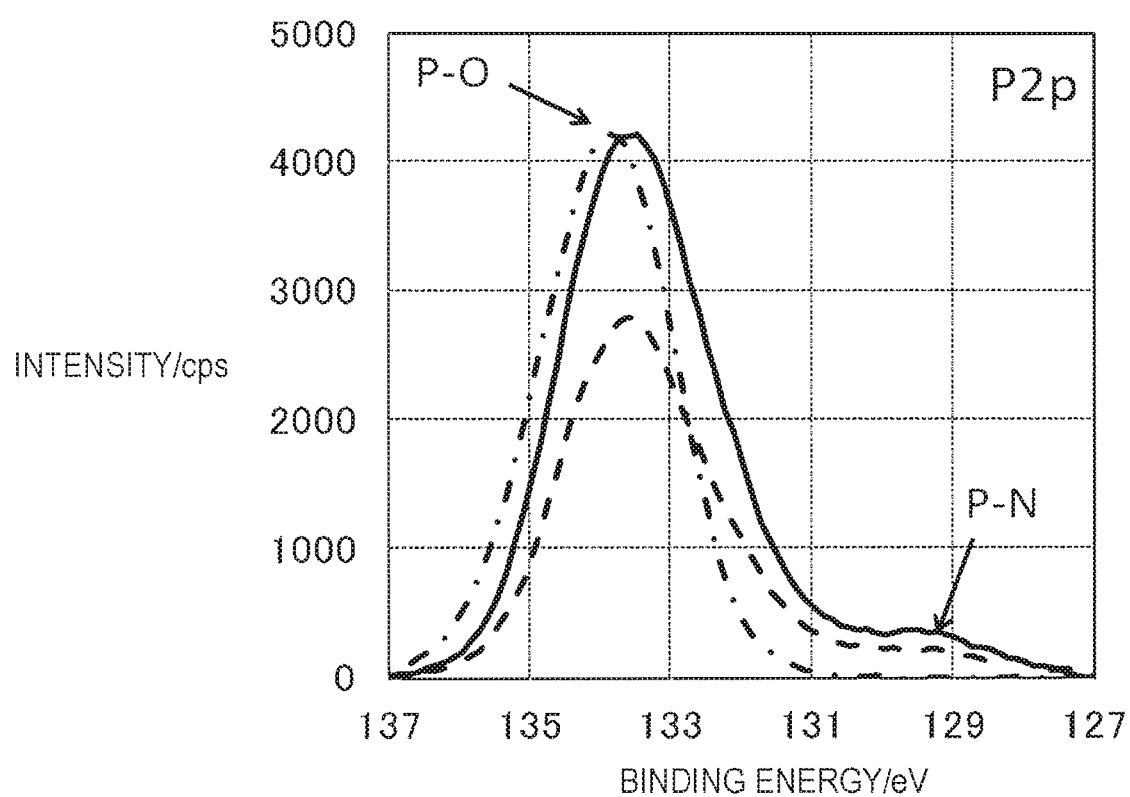

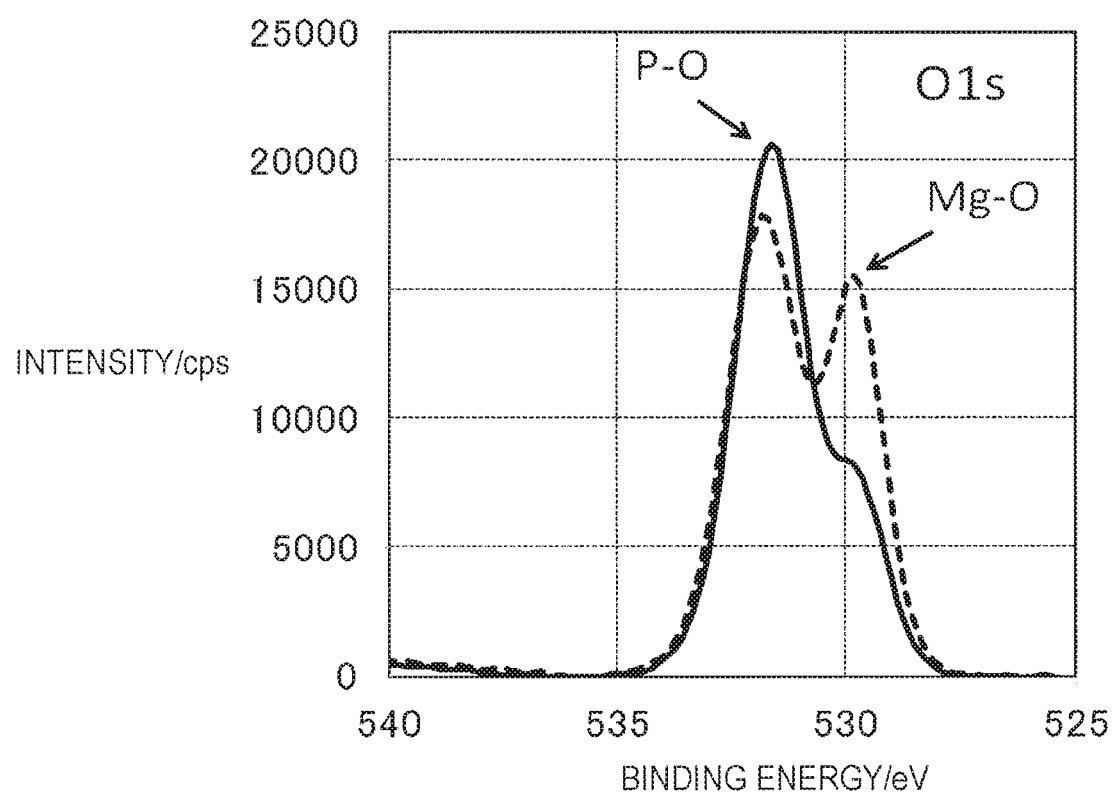

SOLID ELECTROLYTE CONTAINING OXYNITRIDE, AND SECONDARY BATTERY INCLUDING THE SOLID ELECTROLYTE

RELATED APPLICATIONS

This application is a Continuation of application Ser. No. 15/371,063, now U.S. Pat. No. 10,074,872, filed Dec. 6, 2016, which claims the benefit of priority to Japanese Application No. 2016-132614, filed Jul. 4, 2016 and Japanese Application No. 2016-161513, filed Aug. 19, 2016, the disclosures of which are incorporated in their entirety by reference herein.

BACKGROUND

1. Technical Field

The present disclosure relates to a solid electrolyte containing an oxynitride and a secondary battery including the solid electrolyte.

2. Description of the Related Art

In recent years, secondary batteries using polyvalent ions as mobile ions have been investigated.

SUMMARY

One non-limiting and exemplary embodiment provides a novel solid electrolyte containing alkaline-earth metal.

In one general aspect, the techniques disclosed here feature a solid electrolyte including an oxynitride that contains an alkaline-earth metal, phosphorus, oxygen, and nitrogen. A P2p spectrum obtained by an X-ray photoelectron spectroscopy measurement of the oxynitride contains a peak component originating from a P—N bond.

It should be noted that comprehensive or specific embodiments may be implemented as a second battery, or method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2A is a flowchart showing an example of a method for producing a solid electrolyte according to an embodiment;

FIG. 2B is a flowchart showing an example of a method for producing a solid electrolyte according to an embodiment;

FIG. 3 is a graph showing P2p spectra obtained by measuring a solid electrolyte in Example 1, a solid electrolyte in Example 2, and magnesium phosphate ($Mg_3(PO_4)_2$) by XPS;

FIG. 4A is a graph showing O1s spectra obtained by measuring the solid electrolytes in Examples 1 and 2 by XPS;

DETAILED DESCRIPTION

Underlying Knowledge Forming Basis of the Present Disclosure

Knowledge obtained by the inventors will be described below.

Solid electrolytes have higher ionic resistance as compared to typical electrolyte solutions. The resistance between a positive electrode active material and a solid electrolyte and the resistance of the interface between the solid electrolyte and a negative electrode active material are also high. Therefore, as the thickness of a solid electrolyte layer is larger, the internal resistance of a battery is higher and the voltage drop is larger; hence, it is difficult to obtain good charge/discharge characteristics at a large current. As a result, for example, a problem that the charge time is long is caused.

Therefore, a solid electrolyte practically used in, for example, lithium ion secondary batteries is limited. A solid electrolyte containing a divalent or higher valent metal is not in practical use.

An embodiment of the present disclosure can provide a solid electrolyte containing an oxynitride containing a divalent metal element.

An oxynitride according to an aspect of the present disclosure can be applied to, for example, a solid electrolyte layer of an all-solid-state battery. For example, when the ionic conductivities of solid electrolytes are equal, the amount of charge that moves when a divalent metal ion moves is twice the amount of charge that moves when a monovalent metal ion moves. That is, a secondary battery containing a solid electrolyte containing divalent metal ions as mobile ions can be increased in theoretical capacity as compared to a secondary battery containing a solid electrolyte containing monovalent metal ions as mobile ions.

EMBODIMENTS

Solid electrolytes according to various embodiments, methods for producing the solid electrolytes, and secondary batteries containing the solid electrolytes are exemplified below. As shown in the present disclosure, materials, compositions, thicknesses, shapes, characteristics, steps of each production method, and the order of the steps are for exemplification only. A plurality of steps of a production method may be performed concurrently or in different periods.

An oxynitride film and a method for producing the same are mainly described below. Incidentally, the oxynitride film is an example of a "solid electrolyte containing an oxynitride". A solid electrolyte according to the present disclosure is not limited to any film. In the present disclosure, magnesium phosphorus oxynitride is referred to as "MgPON" in some cases for convenience of description and is not limited to a specific composition ratio.

1. PRODUCTION APPARATUS

Figure 1:
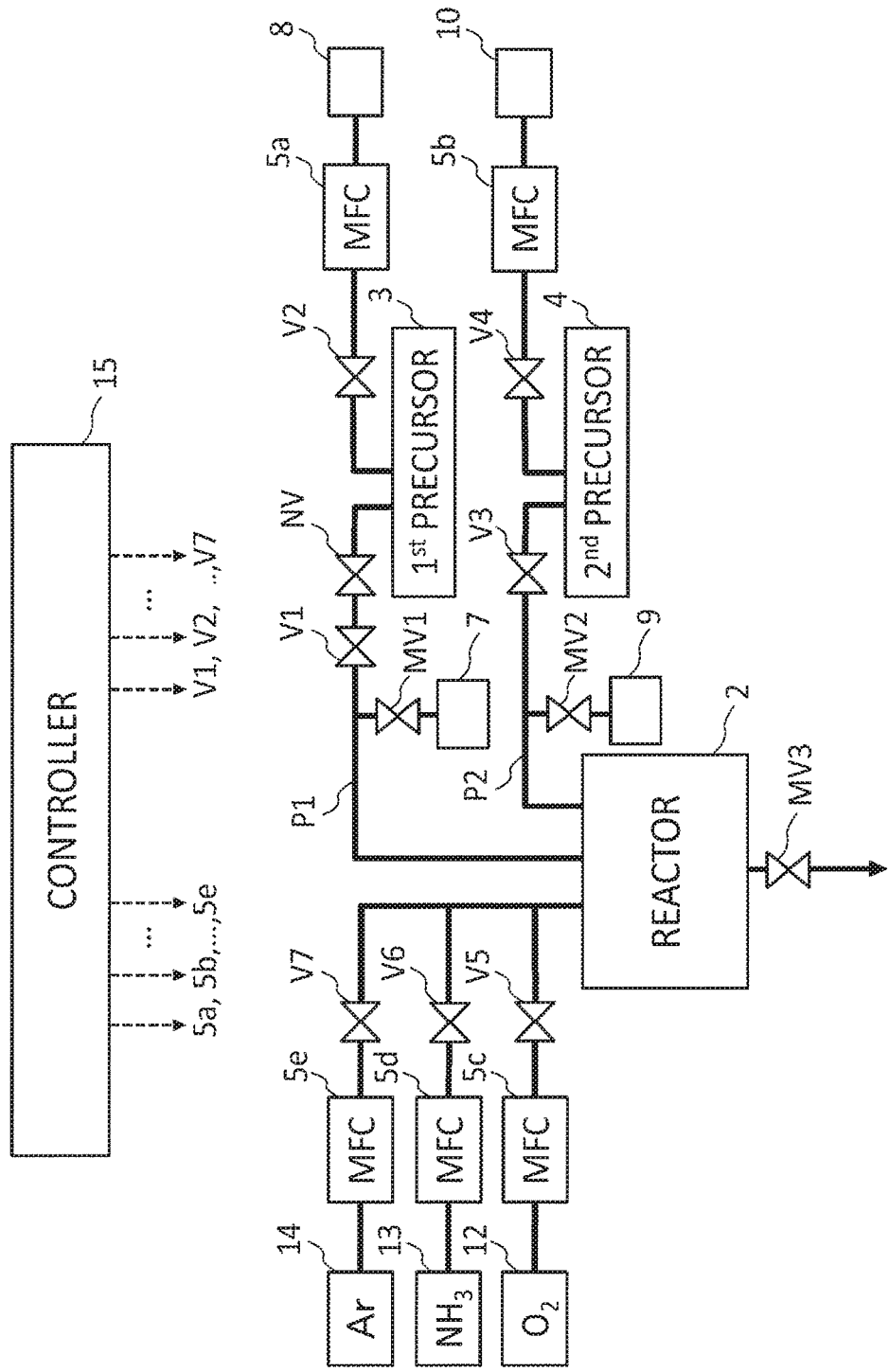
FIG. 1 is a diagram of an example of the configuration of a reaction apparatus for producing solid electrolyte according to an embodiment.

FIG. 1 shows an example of the configuration of a production apparatus 1 for forming an oxynitride film according to an embodiment by an atomic layer deposition (ALD) process. The production apparatus 1 includes a reactor 2, a controller 15, a first precursor supply section 3, a second precursor supply section 4, an oxygen supply section 12, a nitrogen supply section 13, and a purge gas supply section 14.

The reactor 2 is, for example, a process chamber.

The first precursor supply section 3 supplies a first precursor into the reactor 2. The first precursor contains network formers. The first precursor supply section 3 is, for example, a bottle for holding the first precursor. In the present disclosure, the term "precursor" means source material for ALD process.

The second precursor supply section 4 supplies a second precursor into the reactor 2. The second precursor contains alkaline-earth metal. The second precursor supply section 4 is, for example, a bottle for holding the second precursor.

The production apparatus 1 further includes a first pipe P1 extending from the first precursor supply section 3 to the reactor 2 and a second pipe P2 extending from the second precursor supply section 4 to the reactor 2.

The oxygen supply section 12 supplies an oxygen gas and/or an ozone gas into the reactor 2. The nitrogen supply section 13 supplies a nitrogen gas and/or an ammonia gas into the reactor 2. The purge gas supply section 14 supplies a purge gas into the reactor 2 to purge gases remaining in the reactor 2.

The production apparatus 1 further includes auxiliary gas supply sections 7 to 10, mass flow controllers 5a to 5e, valves V1 to V7, manual valves MV1 to MV3, ant a needle valve NV as shown in FIG. 1.

The controller 15 controls, for example, the valves V1 to V7 and the mass flow controllers 5a to 5e. The controller 15 includes, for example, a memory and a processor. The controller 15 further includes, for example, a semiconductor device, a semiconductor integrated circuit (IC), and a large scale integration (LSI) or an electronic circuit which is a combination of the semiconductor device, the IC, and the LSI. The LSI or the IC may be integrated in a single chip or may be composed of a plurality of chips. For example, each functional block may be integrated in a single chip. The LSI and the IC may be called, for example, a system LSI, a very large scale integration (VLSI), or an ultra-large scale integration (UVLSI) depending on the degree of integration.

A commercially available product may be applied to the production apparatus 1 depending on the type of a target oxynitride film. Commercially available production apparatuses include, for example, those, such as Savannah Systems, Fuji Systems, and Phoenix Systems, available from Ultratech/Cambridge NanoTech; those, such as ALD-series, available from Showa Shinku Co., Ltd.; those, such as TFS 200, TFS 500, TFS 120P 400A, and P800, available from Beneq; those, such as OpAL and FlexAL, available from Oxford Instruments; those, such as InPassion ALD 4, InPassion ALD 6, and InPassion ALD 8, available from SoLay Tec; those, such as AT-400 ALD System, available from ANRIC TECHNOLOGIES; and those, such as LabNano and LabNano-PE, available from Ensure NanoTech. In the case where the commercially available product is applied to the production apparatus 1, for example, a program for executing various flows below is stored in the memory in the controller 15 and is executed by the processor in the controller 15, whereby the production apparatus 1 can be operated in this embodiment.

2. PRODUCTION METHOD

A method for producing the oxynitride film using the production apparatus 1 will be described below as an example of a method for producing the oxynitride film according to this embodiment. In the present disclosure, the oxynitride film and the method for producing the oxynitride film are not limited to a specific production apparatus. In the present disclosure, each step of a production method may be performed on the basis of a predetermined program stored in a production apparatus or may be performed by manually operating a production apparatus.

[2-1. Overall Flow]

FIG. 2A is a flowchart showing an example of the method for producing the oxynitride film according to this embodiment. As shown in FIG. 2A, the method includes a step S1 of supplying the first precursor, which contains the network formers, into the reactor 2; a step S2 of supplying an oxygen gas and/or an ozone gas into the reactor 2; a step S3 of supplying the second precursor, which contains the alkaline-earth metal, into the reactor 2; and a step S4 of supplying the ammonia gas and/or a nitrogen gas into the reactor 2. The method further includes, for example, a step of supplying a purge gas into the reactor 2.

The order of these steps, the timing of these steps, and the number of times these steps are performed are not particularly limited. For example, a flow shown in FIG. 2A may be repeatedly performed. For example, some of these steps may be concurrently performed. For example, the step S1 is performed at least once before the step S2 or S4. For example, the step S1 and the step S3 are performed in different periods.

In the case of the order shown in FIG. 2A, the first precursor is oxidized in the step S2. This allows a skeleton composed of the network formers bonded to each other to be obtained. In the step S3, the alkaline-earth metal is bonded to the skeleton. In the step S4, a nitrogen purge is carried out, whereby the oxynitride film is obtained.

The step S2 may be performed between the step S3 and the step S4 again. The second precursor is oxidized by performing the second step S2.

[2-2. Preparation]

Before the production of the oxynitride film is started, a substrate is placed in the reactor 2.

A material for the substrate is, for example, metal, semiconductor, a metal oxide, resin, glass, or ceramic. The metal may be, for example, Au. The metal oxide may be, for example, a metal composite oxide. Examples of the resin include polyester, polycarbonate, a fluorocarbon resin, and an acrylic resin. Examples of the glass include soda-lime glass and quartz glass. Examples of the ceramic include aluminum oxide, gallium nitride, sapphire, and silicon carbide. For example, a thermal oxide ($SiO_2$) with a thickness of 400 nm may be formed on a Si substrate.

The temperature in the reactor 2 is not particularly limited and may be 250° C. to 550° C., 300° C. to 500° C., or 320° C. to 480° C. When the first precursor and/or the second precursor contains carbon, setting the temperature in the reactor 2 to 250° C. or higher enables the first precursor and/or the second precursor to be appropriately burned.

[2-3. Supply of First Precursor]

In the step S1, the first precursor, which contains the network formers, is supplied into the reactor 2. For example, the valve V1 is opened, whereby the first precursor is supplied into reactor 2 from the first precursor supply section 3 as shown in FIG. 1.

The temperature of the first precursor supply section 3 is not particularly limited and may be 1° C. to 50° C. or 5° C. to 45° C. when the vapor pressure of the first precursor is high.

In the step S1, an auxiliary gas may be supplied to the reactor 2 from the auxiliary gas supply section 7 by opening the manual valve MV1. The auxiliary gas sweeps the first precursor, released into the first pipe P1 from the first precursor supply section 3, to the reactor 2. The flow rate of the auxiliary gas is not particularly limited and may be 20 ml/min to 60 ml/min or 25 ml/min to 50 ml/min. In the step S1, the flow rate of the first precursor may be controlled by adjusting the opening of the needle valve NV. The opening of the needle valve NV is, for example, 10% to 60%.

In the step S1, the auxiliary gas may be supplied to the reactor 2 from the auxiliary gas supply section 8 by opening the valve V2 depending on the type of the first precursor. The auxiliary gas sweeps the first precursor into the reactor 2. The flow rate of the auxiliary gas can be controlled by the mass flow controller 5a. The temperature of the auxiliary gas supplied from each of the auxiliary gas supply sections 7 and 8 is not particularly limited and may be 100° C. to 300° C. or 120° C. to 280° C.

The auxiliary gas is, for example, an inert gas. Examples of the inert gas include an argon gas and a nitrogen gas. The auxiliary gas may be a single type of gas or a mixture of two or more types of gases.

The term "network former" refers to atoms or atom groups (i.e. functional groups) which are directly or indirectly bonded with each other to form a network structure or which have already formed the network structure. The network structure is the skeleton of the oxynitride film. The network formers may be, for example, portions of a molecule of the first precursor. Another portion of this molecule may be separated when the network structure is formed. The network formers contain phosphorus.

The first precursor is not particularly limited and is, for example, a phosphorus-containing compound. Examples of the phosphorus-containing compound include tris(dimethylamino)phosphine (TDMAP), trimethylphosphine (TMP), triethylphosphine (TEP), and tert-butylphosphine (TBP). These compounds may be used alone or in combination.

The step S1 is finished by closing the valve V1. The duration of the step S1 is not particularly limited and may be about 0.01 seconds to 10 seconds, about 0.05 seconds to 8 seconds, or about 0.1 seconds to 5 seconds.

[2-4. Supply of Oxygen]

In the step S2, the oxygen gas and/or the ozone gas is supplied into the reactor 2. For example, the valve V5 is opened, whereby the oxygen gas and/or the ozone gas is supplied into the reactor 2 from the oxygen supply section 12 as shown in FIG. 1.

The oxygen gas may contain, for example, oxygen radicals produced by a plasma treatment. Plasma ALD enables reactivity to be increased and also enables the temperature of a system to be reduced.

The ozone gas may be produced in such a manner that, for example, oxygen is supplied to an OT-020 ozone generator available from Ozone Technology as described in U.S. Patent Application Publication No. 2011/0099798 A1.

The flow rate of the oxygen gas and/or the ozone gas is controlled by the mass flow controller 5c and may be, for example, 20 ml/min to 60 ml/min or 30 ml/min to 50 ml/min. The concentration of the oxygen gas and/or the ozone gas is not particularly limited and may be, for example, 100%. The temperature of the oxygen gas and/or the ozone gas is not particularly limited and may be, for example, 100° C. to 300° C. or 120° C. to 280° C.

The step S2 is finished by closing the valve V5. The duration of the step S2 corresponds to the time from opening the valve V5 to closing the valve V5. The duration of the step S2 is not particularly limited and may be about 0.1 seconds to 15 seconds, about 0.2 seconds to 10 seconds, or about 0.2 seconds to 8 seconds.

[2-5. Supply of Second Precursor]

In the step S3, the second precursor, which contains the alkaline-earth metal, is supplied into the reactor 2. For example, the valve V3 is opened, whereby the second precursor is supplied into the reactor 2 from the second precursor supply section 4 as shown in FIG. 1.

The temperature of the second precursor supply section 4 is not particularly limited and may be 90° C. to 190° C. or 95° C. to 180° C. when the vapor pressure of the second precursor is low.

In the step S3, the auxiliary gas may be supplied to the reactor 2 from the auxiliary gas supply section 9 by opening the manual valve MV2. The auxiliary gas sweeps the second precursor, released into the second pipe P2 from the second precursor supply section 4, to the reactor 2. The flow rate of the auxiliary gas is not particularly limited and may be 20 ml/min to 60 ml/min or 30 ml/min to 55 ml/min.

In the step S3, the auxiliary gas may be supplied to the reactor 2 from the auxiliary gas supply section 10 by opening the valve V4 depending on the type of the second precursor. The auxiliary gas sweeps the second precursor to the reactor 2. The flow rate of the auxiliary gas can be controlled by the mass flow controller 5b. The flow rate of the auxiliary gas is not particularly limited and may be 1 ml/min to 30 ml/min or 5 ml/min to 20 ml/min.

The temperature of the auxiliary gas supplied from each of the auxiliary gas supply sections 9 and 10 is not particularly limited and may be 100° C. to 300° C. or 120° C. to 280° C.

The auxiliary gas supplied from each of the auxiliary gas supply sections 9 and 10 may be substantially the same as that exemplified in the description of the step S1.

The second precursor is a substance containing the alkaline-earth metal. Examples of the alkaline-earth metal include Be, Mg, Ca, Sr, Ba, and Ra. The alkaline-earth metal contains, for example, Mg.

The second precursor is not particularly limited. Examples of the second precursor include bis(cyclopentadienyl) magnesium ($Cp_2Mg$), bis(methylcyclopentadienyl) magnesium ($MeCp_2Mg$), and bis(ethylcyclopentadienyl) magnesium ($EtCp_2Mg$). These compounds may be used alone or in combination.

The step S3 is finished by closing the valve V3. The duration of the step S3 corresponds to, for example, the time from opening the valve V3 to closing the valve V3. The duration of the step S3 is not particularly limited and may be about 0.01 seconds to 10 seconds, about 0.05 seconds to 8 seconds, or about 0.1 seconds to 5 seconds.

[2-6. Supply of Nitrogen]

In the step S4, the ammonia gas and/or the nitrogen gas is supplied into the reactor 2. For example, the valve V6 is opened, whereby the ammonia gas and/or the nitrogen gas is supplied into reactor 2 from the nitrogen supply section 13 as shown in FIG. 1.

The nitrogen gas may contain, for example, nitrogen radicals produced by a plasma treatment. Plasma ALD enables reactivity to be increased and also enables the temperature of a system to be reduced.

The flow rate of the ammonia gas and/or the nitrogen gas is controlled by the mass flow controller 5d. The flow rate of the ammonia gas and/or the nitrogen gas may be, for example, 20 ml/min to 60 ml/min or 30 ml/min to 50 ml/min. Alternatively, the flow rate of the ammonia gas and/or the nitrogen gas may be 100 ml/min to 200 ml/min. The concentration of the ammonia gas and/or gas serving as a nitrogen supply source is not particularly limited and may be, for example, 100%. The temperature the ammonia gas and/or the gas serving as the nitrogen supply source is not particularly limited and may be, for example, 100° C. to 300° C. or 120° C. to 280° C.

The step S4 is finished by closing the valve V6. The duration of the step S4 corresponds to the time from opening the valve V6 to closing the valve V6. The duration of the step S4 is not particularly limited and may be about 0.1 seconds to 15 seconds, about 0.2 seconds to 10 seconds, or about 0.2 seconds to 8 seconds.

[2-7. Supply of Purge Gas]

In the steps S11 to S14, the purge gas is supplied into the reactor 2, whereby gases remaining in the reactor 2 are purged. For example, the valve V7 is opened, whereby the purge gas is supplied into the reactor 2 from the purge gas supply section 14 as shown in FIG. 1.

The flow rate of the purge gas is controlled by the mass flow controller 5e and may be, for example, 20 ml/min to 60 ml/min or 30 ml/min to 50 ml/min. The temperature of the purge gas is not particularly limited and may be, for example, 100° C. to 300° C. or 120° C. to 280° C.

Each of the steps S11 to S14 may be performed, for example, after a corresponding one or a specific one of the steps S1 to S4 is completed. Alternatively, each of the steps S11 to S14 may be performed concurrently with at least one of the steps S1 to S4. For example, in order to sufficiently remove gases in the reactor 2, one of the steps S11 to S14 may be continuously performed as a background process until the formation of the oxynitride film is completed after the formation of the oxynitride film is started.

The duration of each of the steps S11 to S14 is not particularly limited and may be about 0.1 seconds to 20 seconds, about 0.5 seconds to 15 seconds, or about 1.0 second to 10 seconds.

The purge gas is, for example, an inert gas. The inert gas is, for example, an argon gas and/or a nitrogen gas. The purge gas may be a single type of gas or a mixture of two or more types of gases.

[2-8. Supply of Ammonia Gas]

The method for producing the oxynitride film according to this embodiment may further include a step of supplying the ammonia gas into the reactor 2 in addition to the step S4. The step of supplying the ammonia gas may be performed concurrently with at least one selected from the group consisting of the steps S1 to S3 and S11 to S14. This enables nitrogen to be stably introduced into the oxynitride film and also enables the percentage of nitrogen in the oxynitride film to be increased.

Alternatively, the step S4 may be a step of supplying the ammonia gas into the reactor 2 and may be performed concurrently with at least one selected from the group consisting of the steps S1 to S3 and S11 to S14.

In this case, for example, the valve V6 is opened, whereby the ammonia gas is supplied into reactor 2 as shown in FIG. 1. For example, the valve V6 may be consistently open until the formation of the oxynitride film is completed after the formation of the oxynitride film is started. The flow rate of the ammonia gas is not particularly limited and may be, for example, 30 ml/min to 100 ml/min or 50 ml/min to 100 ml/min. The concentration of the ammonia gas is not particularly limited and may be, for example, 100%. The temperature of the ammonia gas is not particularly limited and may be 100° C. to 200° C. The temperature of the ammonia gas may be 180° C. to 200° C. for the purpose of reducing the decrease in temperature of the reactor 2. The supply time of the ammonia gas is not particularly limited.

[2-9. Degree of Vacuum in Reactor and Temperature of Pipes]

In the method for producing the oxynitride film according to this embodiment, the degree of vacuum in the reactor 2 may be controlled. The degree of vacuum in the reactor 2 can be controlled by adjusting, for example, the opening of the manual valve MV3 for evacuation as shown in FIG. 1.

The degree of vacuum in the reactor 2 is set depending on the type of the oxynitride film and may be, for example, 0.1 Torr to 8.0 Torr or 0.5 Torr to 5.0 Torr. Setting the degree of vacuum in the reactor 2 to 0.1 Torr or more allows, for example, the first precursor to be continuously supplied into the reactor 2, whereby the first precursor is sufficiently oxidized. Therefore, for example, when the first precursor contains carbon, the amount of carbon in the oxynitride film can be reduced by sufficient oxidation. Setting the degree of vacuum in the reactor 2 to 8.0 Torr or less allows, for example, the supply of the second precursor to be appropriately controlled. The degree of vacuum in the reactor 2 can be measured with, for example, a Pirani gauge, TPR280 DN16 ISO-KF, available from PFEIFFER VACUUM.

In the method for producing the oxynitride film according to this embodiment, the temperature of each pipe may be set, for example, as below.

Referring to FIG. 1, for example, the temperature of the first pipe P1 and the temperature of the second pipe P2 are set higher than the boiling point or sublimation temperature of the first precursor and higher than the boiling point or sublimation temperature of the second precursor. When the first precursor is, for example, tris(dimethylamino)phosphine, the boiling point of the first precursor is about 48° C. to 50° C. When the second precursor is, for example, bis(ethylcyclopentadienyl)magnesium, the boiling point of the second precursor is about 65° C.

For example, the temperature of the first pipe P1 is higher than the temperature of the first precursor supply section 3 and the temperature of the second pipe P2 is higher than the temperature of the second precursor supply section 4. This enables the solidification of the first precursor in the first pipe P1 to be prevented and also enables the solidification of the second precursor in the second pipe P2 to be prevented.

The temperature of the first pipe P1 and the temperature of the second pipe P2 may be 55° C. or more higher than the temperature of the first precursor supply section 3 and may be 55° C. or more higher than the temperature of the second precursor supply section 4. The temperature of the first pipe P1 and the temperature of the second pipe P2 may be 60° C. or more higher than the temperature of the first precursor supply section 3 and may be 60° C. or more higher than the temperature of the second precursor supply section 4.

When the temperature of the first precursor supply section 3 is, for example, 35° C., the temperature of the first pipe P1 may be set to about 110° C. When the temperature of the second precursor supply section 4 is 100° C., the temperature of the second pipe P2 may be set to about 180° C.

[2-10. Repetitive Treatment]

FIG. 2B is a flowchart showing an example of a method for producing an oxynitride film according to an embodiment. The method shown in FIG. 2B includes a step S1 of supplying the first precursor into the reactor 2, a step S2 of supplying the oxygen gas and/or the ozone gas into the reactor 2, a step S3 of supplying the second precursor into the reactor 2, a step S4 of supplying the ammonia gas and/or the nitrogen gas into the reactor 2, steps S11 to S14 of supplying the purge gas into the reactor 2, and a step S5 of judging whether the number of repetitions has reached a preset value. This allows a cycle including the steps S1 to S5 and S11 to S14 to be repeated a plurality of times. For FIG. 2B, matters described with reference to FIG. 2A will not be described in detail.

In the method shown in FIG. 2B, after each of the steps S1 to S4 is completed, a corresponding one of the steps S11 to S14 is performed.

In the example shown in FIG. 2B, whether the number of repetitions has reached the preset value is judged in the step S5. In the case where the number of repetitions has not reached the preset value (NO in the step S5), the cycle returns to the step S1. In the case where the number of repetitions has reached the preset value (YES in the step S5), the formation of the oxynitride film is completed.

The number of repetitions of the cycle is not particularly limited and is appropriately set depending on, for example, the target thickness of the oxynitride film, the type of the first precursor, and the type of the second precursor. The number of repetitions of the cycle may be, for example, about 2 to 8,000 or about 5 to 3,000. In the case where the thickness of the oxynitride film is adjusted to, for example, about 500 nm, the number of repetitions of the cycle may be set to 1,000 to 2,000. Alternatively, in the case where the thickness of the oxynitride film is adjusted to 50 nm or less, the number of repetitions of the cycle may be set to 150 or less.

In the present disclosure, the term "repetition" is not limited to the case where each step is completed in one cycle. For example, in the case where the ammonia gas is continuously supplied into the reactor 2 until the formation of the oxynitride film is completed after the formation of the oxynitride film is started, the step is not completed in one cycle but is continuously performed over a plurality of cycles. In the present disclosure, the term "repetition" may include this case.

In this embodiment, the thickness of the oxynitride film is not particularly limited. The thickness of the oxynitride film may be, for example, 5 μm or less, 2 μm or less, 550 nm or less, or 300 nm or less. The thickness of the oxynitride film may be, for example, 200 nm or less, 150 nm or less, 110 nm or less, 100 nm or less, or 50 nm or less. The lower limit of the thickness of the oxynitride film is not particularly limited and may be 0.1 nm or more or 1 nm or more.

In the example shown in FIG. 2B, each of the steps S1 to S4 is performed once in one cycle. The number of times each of the steps S1 to S4 is performed in one cycle is not limited to one. The number of times each of the steps S11 to S14 is performed and the timing of each of the steps S11 to S14 are not limited to the example shown in FIG. 2B.

Whether the formation of the oxynitride film is continued or is finished may be judged on the basis of a condition different from the number of repetitions. The formation of the oxynitride film may be finished on the basis that, for example, the elapsed time reaches a predetermined value or on the basis that, for example, the thickness of the oxynitride film reaches a predetermined value.

The relative proportion of each element in the oxynitride film can be controlled depending on, for example, the flow rate of the first precursor, the duration of a pulse of the first precursor, the flow rate of the second precursor, the duration of a pulse of the second precursor, and the duration of a pulse of the purge gas. The relative proportion of each element in the oxynitride film may be controlled in such a manner that, for example, the flow rate of one of the first and second precursors that has a lower vapor pressure is set and the flow rate of another element gas and the duration of a pulse of this element gas are set on the basis of the flow rate of one of the first and second precursors that has a lower vapor pressure.

[2-11. Method for Producing MgPON Film]

An example of a method for producing an oxynitride film, an MgPON film, will be described below. Matters described with reference to FIG. 2A or 2B will not be described in detail.

A method for producing the MgPON film includes, for example, a step S1 of supplying a first precursor containing phosphorus into the reactor 2, a step S2 of supplying an oxygen gas and/or an ozone gas into the reactor 2, a step S3 of supplying a second precursor containing magnesium into the reactor 2, and a step S4 of supplying an ammonia and/or a nitrogen gas into the reactor 2. These steps are performed in the order shown in, for example, FIG. 2A.

Phosphorus in the first precursor binds to oxygen existing on a surface of a substrate. Oxygen contained in the oxygen gas and/or the ozone gas supplied in step S2 oxidizes phosphorus on the substrate surface to form a phosphate skeleton. Magnesium in the second precursor binds to oxygen in the phosphate skeleton (for example, coordinate bonding or ionic bonding). Nitrogen contained in the oxygen gas and/or the nitrogen gas binds to phosphorus in the phosphate skeleton that is uncombined with oxygen.

The step S1 is performed at least once before, for example, the step S3. This allows magnesium to be introduced in such a state that the phosphate skeleton is present, thereby enabling the formation of a non-conductive film to be prevented. The step S1 may be performed at least once before, for example, the step S2 and/or may be performed at least once before, for example, the step S4.

The order of these steps is not limited to those described above. For example, the step S3 may be performed after the step S2. The step S3 may be performed after the step S4. The step S3 may be performed before the step S1. The step S2 may be performed between the step S3 and the step S4 again. When the method for producing the MgPON film includes, for example, such a repetitive treatment as shown in FIG. 2B, the phosphate skeleton is formed in the first cycle and therefore the order of these steps in the second and subsequent cycles may be arbitrarily set.

The phosphate skeleton is formed by performing the step S1 at least once before the step S2. For example, the steps S1, S11, S2, and S12 are performed in that order as shown in FIG. 2B, whereby the phosphate skeleton is formed.

The relative proportion of each element in the MgPON film can be controlled depending on, for example, the flow rate of the first precursor, the duration of a pulse of the first precursor, the flow rate of the second precursor, the duration of a pulse of the second precursor, and the duration of a pulse of the purge gas. The relative proportion of each element in the MgPON film may be controlled in such a manner that, for example, the flow rate of the second precursor, which has the lowest vapor pressure and contains magnesium, is set and the flow rate of another element gas and the duration of a pulse of this element gas are set on the basis of the flow rate of the second precursor. The amount of magnesium is set such that the amount of magnesium is sufficient to grow a film and is not too large and nitrogen can be introduced into the film.

The temperature in the reactor 2 is set to, for example, 400° C. to lower than 480° C.

The vapor pressure of the first precursor, which contains phosphorus, is relatively high and therefore the temperature of the first precursor supply section 3 may be, for example, about 1° C. to 50° C. or about 5° C. to 45° C. The temperature of the second precursor supply section 4 may be, for example, 40° C. to 50° C. The temperature of the purge gas may be, for example, 150° C. to 250° C. The temperature of the oxygen gas and/or the ozone gas may be, for example, 150° C. to 250° C. The temperature of the ammonia gas and/or the nitrogen gas may be, for example, 150° C. to 250° C. These temperature conditions enable the uneven formation of the MgPON film to be inhibited. The flow rate of each gas, the duration of a pulse of the gas, the purge time, and the like may be appropriately selected from the above-mentioned conditions.

3. OXYNITRIDE FILM

An example of the structure of the oxynitride film will be described below. The oxynitride film may be one produced by, for example, the above-mentioned method.

The oxynitride film contains the network formers, which contain phosphorus, and the alkaline-earth metal.

A P2p spectrum obtained by the X-ray photoelectron spectroscopy measurement (XPS measurement) of the oxynitride film contains a peak component originating from a P—O bond and a peak component originating from a P—N bond. The peak component originating from the P—O bond is a peak component appearing at about 133 eV to 135 eV. The peak component originating from the P—N bond is a peak component appearing at about 127.5 eV to 130.5 eV.

The oxynitride film is characterized in that the P2p spectrum contains the peak component originating from the P—N bond. This peak component reflects that introduced nitrogen is appropriately bonded to phosphorus in the oxynitride film. As shown in various examples below, it is inferred that P—N bonds in the oxynitride film can enhance the ionic conductivity of an alkaline-earth metal (for example, magnesium) in the oxynitride film. Thus, when the P2p spectrum of the oxynitride film shows the peak component originating from the P—N bond, the oxynitride film can effectively function as a solid electrolyte.

In the P2p spectrum, the intensity of the peak component originating from the P—N bond may be, for example, 0.1% or more of the intensity of the peak component originating from the P—O bond.

An N1s spectrum of the oxynitride film may contain a peak component originating from triply coordinated nitrogen (—N<) and a peak component originating from doubly coordinated nitrogen (—N=). The intensity of the peak component originating from triply coordinated nitrogen may be 50% or less, 40% or less, or 30% or less of the intensity of the peak component originating from doubly coordinated nitrogen. As used herein, the term "triply coordinated nitrogen" refers to a nitrogen atom singly bonded to three atoms and the term "doubly coordinated nitrogen" refers to a nitrogen atom singly bonded to a single atom and doubly bonded to another single atom. A nitrogen atom binds to, for example, atoms making up the network formers.

The peak component originating from triply coordinated nitrogen is a peak component appearing at about 399.4 eV. The peak component originating from doubly coordinated nitrogen is a peak component appearing at about 397.9 eV.

When the oxynitride film contains magnesium as an alkaline-earth metal, an O1s spectrum obtained by the XPS measurement of the oxynitride film contains a peak component originating from a P—O bond and a peak component originating from an Mg—O bond. In the O1s spectrum, the peak component originating from the P—O bond is a peak component appearing at about 531.8 eV and the peak component originating from the Mg—O bond is a peak component appearing at about 529.7 eV.

It is inferred that the peak component originating from the Mg—O bond originates from an impurity, such as MgO, produced in the oxynitride film. Magnesium, which forms MgO or the like, does not contribute to ionic conduction. Thus, as the intensity of the peak component originating from the Mg—O bond is lower, ionic conduction occurs more efficiently in the oxynitride film. Thus, the intensity of the peak component originating from the Mg—O bond is preferably lower than the intensity of, for example, the peak component originating from the P—O bond. The ratio of the flow rate of the ammonia gas and/or the gas serving as the nitrogen supply source to the flow rate of an inert gas (for example, an argon gas) may be set to, for example, 30% or more. This allows the peak component originating from the P—O bond to be higher than the intensity of the peak component originating from the Mg—O bond.

In the present disclosure, the term "peak component" includes not only those appearing on an XPS spectrum as peaks but also those found by fitting the XPS spectrum.

In the oxynitride film, the ratio N/P of nitrogen to phosphorus may satisfy, for example, $0.2 \leq N/P < 1$. Sufficiently introducing nitrogen enables the ionic conductivity of the oxynitride film to be increased. An ALD process can increase the percentage of nitrogen in the oxynitride film as compared to another process (for example, a sputtering process).

When the oxynitride film contains magnesium as an alkaline-earth metal, the ratio Mg/P of magnesium to phosphorus may satisfy, for example, $1.5 \leq Mg/P$. In other words, the ratio Mg/P in the oxynitride film may be greater than the ratio Mg/P in magnesium phosphate ($Mg_3(PO_4)_2$). This allows the amount of magnesium, which is an ion-conducting species, to be increased.

4. SECONDARY BATTERY

The oxynitride film can be used as a solid electrolyte 101 for secondary batteries. For example, a secondary battery 100 according to an embodiment includes a positive electrode 102, a negative electrode 103, and a solid electrolyte 101 containing the above-mentioned oxynitride. The positive electrode 102 includes a positive electrode current collector and a positive electrode active material. The negative electrode 103 includes a negative electrode current collector and a negative electrode active material.

Figure 9:
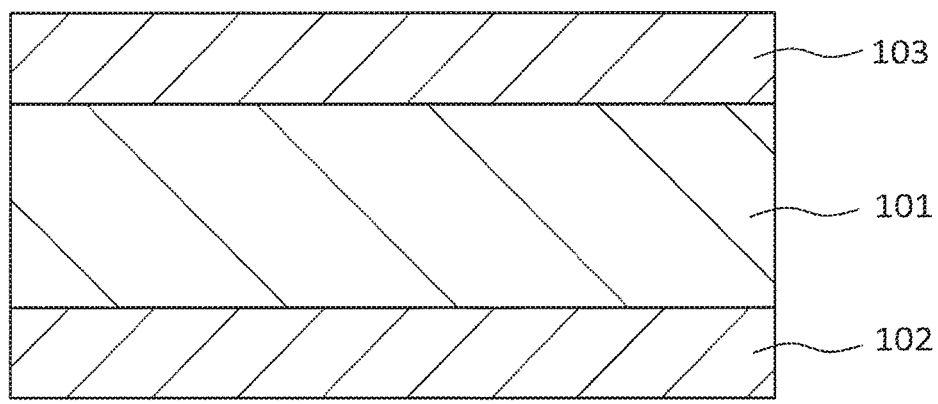
FIG. 9 is a cross-sectional diagram showing an exemplary structure of a secondary battery.

The secondary battery 100 may be, for example, an all-solid-state secondary battery. In this case, as shown in FIG. 9, the oxynitride film may be interposed between the positive electrode 102 and the negative electrode 103. When a voltage is applied between the positive electrode 102 and the negative electrode 103, ion conduction occurs in the oxynitride film. Examples of a positive electrode material that can be used include fluorinated graphite ($(CF)_n$); oxides of metal elements such as scandium (Sc), titanium (Ti), vanadium (V), chromium (Cr), manganese (Mn), iron (Fe), cobalt (Co), nickel (Ni), copper (Cu), and zinc (Zn): and halides of the metal elements. Examples of a negative electrode material that can be used include metals such as magnesium (Mg), titanium (Ti), and tin (Sn) and alloys containing the metals.

In the secondary battery 100, the solid electrolyte 101 may be the oxynitride film only or a stack obtained by stacking the oxynitride film and another film. Examples of the other film include sulfide films and halide films. The solid electrolyte 101 need not be filmy and may be, for example, powder. Thus, in this embodiment, the term "oxynitride film" may be appropriately replaced with the term "oxynitride".

The positive electrode 102 may have an irregular surface. The solid electrolyte 101 may be a film covering the irregular surface. The negative electrode 103 may have an irregular surface. The solid electrolyte 101 may be a film covering this irregular surface. This allows the contact area between an electrode and the solid electrolyte to be large and enables the reaction of the electrode with the solid electrolyte to be activated. A film of the solid electrolyte 101 is formed by, for example, the above-mentioned ALD process so as to have a conformal form following an irregular surface. This allows the solid electrolyte 101 to be formed with few process variations. At least one of the positive electrode 102 and the negative electrode 103 has, for example, a porous shape. The solid electrolyte 101 may have a shape following an irregular surface due to the porous shape.

The positive electrode active material may be composed of, for example, a plurality of active material particles. The solid electrolyte 101 may form films each of which covers the surface of a corresponding one of the active material particles. The negative electrode active material may be composed of, for example, a plurality of active material particles. The solid electrolyte 101 may form films each of which covers the surface of a corresponding one of the active material particles. This allows the contact area between an active material and the solid electrolyte 101 to be large and enables the reaction of the active material with the solid electrolyte 101 to be activated. For example, the ALD process allows a source gas to flow between the active material particles in each step, thereby enabling films of the solid electrolyte 101 to be formed such that each of the solid electrolyte films covers the surface of a corresponding one of the active material particles.

Alternatively, the solid electrolyte 101 may be deposited on the positive electrode current collector or the negative electrode current collector.

In this embodiment, the secondary battery 100 is not limited to the all-solid-state secondary battery. The secondary battery 100 may include, for example, a liquid electrolyte in addition to the solid electrolyte 101. The liquid electrolyte is, for example, $Mg(TFSI)_{2/3}G$. Herein, $Mg(TFSI)_2$ is magnesium bis(trifluoromethanesulfonyl)imide and 3G is triethylene glycol dimethyl ether. The liquid electrolyte may be one obtained by blending, for example, 0.5 M of $Mg(TFSI)_2/3G$ with 1 M of 3G.

5. EXAMPLES

Examples of the present disclosure are described below.

5-1. Example 1

An MgPON film in Example 1 was produced using the production apparatus 1 shown in FIG. 1. Herein, substantially the same production method as that shown in the flowchart in FIG. 2C except the step S4.

Each of the first precursor supply section 3 and the second precursor supply section 4 was a precursor bottle available from Japan Advanced Chemicals Ltd. The reactor 2, a sample holder placed in the reactor 2, the first precursor supply section 3, the second precursor supply section 4, and various pipes used were made of stainless steel (SUS316). Ribbon heaters were wound around the reactor 2, the first precursor supply section 3, the second precursor supply section 4, and the pipes. These parts were heated by energizing the ribbon heaters. The temperature of each of these parts was measured with a thermocouple and was controlled by a temperature controller. The mass flow controllers 5a to 5e and the valves V1 to V7 were controlled using a sequencer, MELSEC-Q, available from Mitsubishi Electric Corporation and a control program available from Nihon Spread K.K. The mass flow controllers 5c and 5e were SEC-E40 available from HORIBA STEC, Co., Ltd. The mass flow controller 5d was SEC-N112MGM available from HORIBA STEC, Co., Ltd. The needle valve NV was a bellows seal valve, SS-4BMG, available from Swageloc Co. The degree of vacuum in the reactor 2 was measured with a Pirani gauge, TPR280 DN16 ISO-KF, available from PFEIFFER VACUUM. The degree of vacuum in the reactor 2 was controlled at $10^{-1}$ Pa to $10^{-3}$ Pa during film formation by adjusting the opening of the manual valve MV3.

A substrate used was a glass substrate provided with Au electrodes. The Au electrodes were comb-shaped electrodes with a pitch of 5 μm. The glass substrate provided with the Au electrodes was placed in the reactor 2. A first precursor used was tris(dimethylamino)phosphine (TDMAP). A second precursor used was bis(ethylcyclopentadienyl) magnesium. A purge gas used was an argon gas. The oxygen supply section 12 was capable of supplying an oxygen gas. The nitrogen supply section 13 was capable of supplying an ammonia gas. The temperature in the reactor 2 was set to 450° C. The temperature of the first precursor supply section 3 was set to 40° C. The temperature of the second precursor supply section 4 was set to 40° C. The temperature of the first pipe P1 was set to 170° C. The temperature of each of all pipes other than the first and second pipes P1 and P2 was set to 200° C. The flow rate of the oxygen gas, the flow rate of the ammonia gas, and the flow rate of the purge gas were set to 50 ml/min, 100 ml/min, and 30 ml/min, respectively. The manual valves MV1 and MV2 were consistently open. The flow rate of an auxiliary gas supplied from each of the auxiliary gas supply sections 7 and 9 was set to 50 ml/min. The opening of the needle valve NV was 37.5%.

Figure 2C:
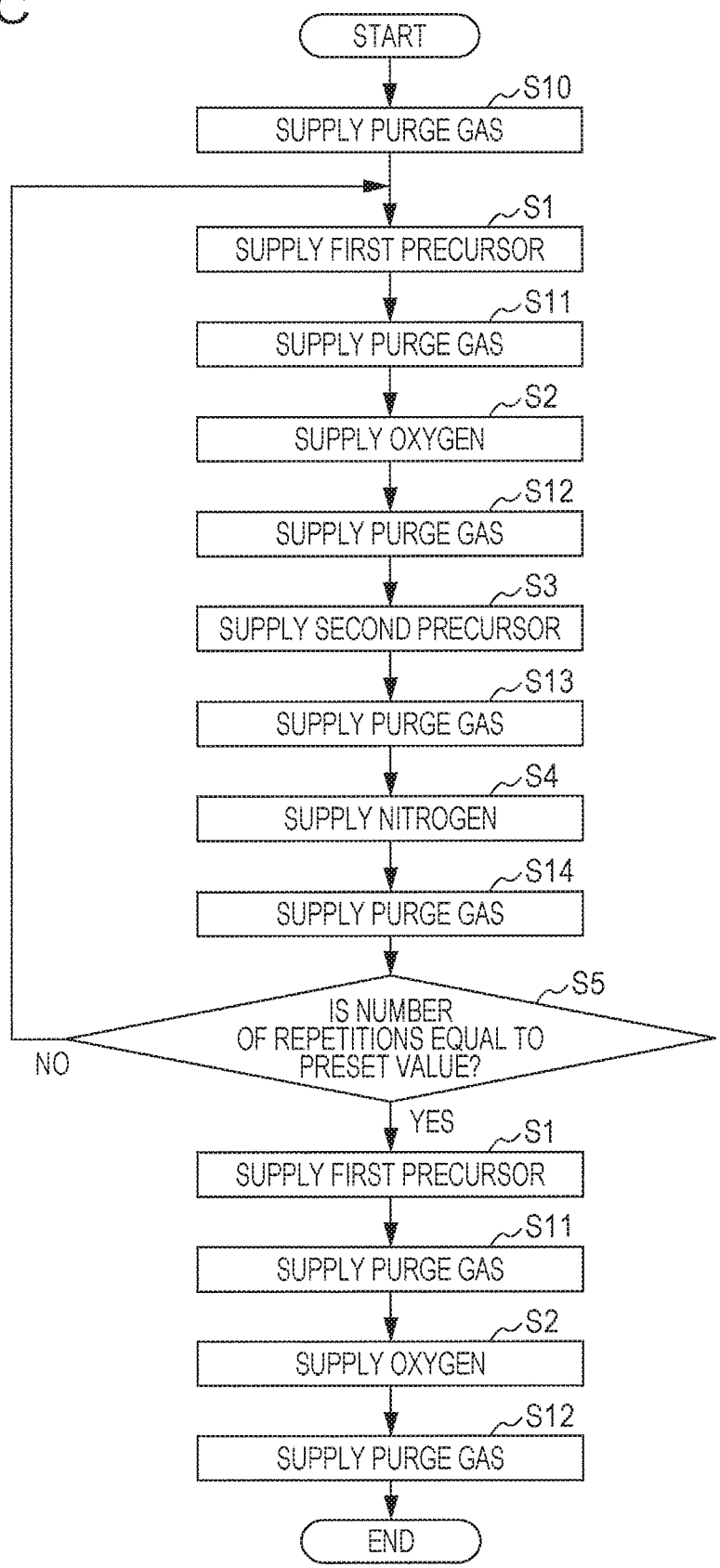
FIG. 2C is a flowchart showing an example of a method for producing a solid electrolyte according to an embodiment.

Before the step S1 shown in FIG. 2C was performed, a preparation step below was performed.

The valve V7 was opened, the purge gas was supplied into the reactor 2 from the purge gas supply section 14 for about 1,800 seconds, and the valve V7 was then closed. Next, the valve V5 was opened, the oxygen gas was supplied into the reactor 2 from the oxygen supply section 12 for 6 seconds, and the valve V5 was then closed. Thereafter, a purge step was performed for 8 seconds. After the preparation step was performed, a repetitive cycle shown in FIG. 2C was performed 5,000 times. A feed material and the treatment time of each step in the repetitive cycle are shown in Table 1 below. Incidentally, the method used in this example was different from the flowchart shown in FIG. 2C in that the step S4 was continuously performed from the start to end of film formation. In particular, the valve V6 was opened simultaneously with the start of the first cycle and was closed simultaneously with the end of the 5,000th cycle. The flow rate of the ammonia gas was 100 ml/min. The temperature of the ammonia gas was 200° C. In the step S1, the duration of a pulse of TDMAP was 1 second. In the step S2, the duration of a pulse of the oxygen gas was 6 seconds. In the step S3, the duration of a pulse of EtCP$_2$Mg was 2.5 seconds. In the steps S11 to S14, the duration of a pulse of the argon gas was 8 seconds, that is, the purge time was 8 seconds. An interval of 1 second was provided between the steps S13 and S14.

TABLE 1

|  | Step | Feed material or feed gas | Pulse time or purge time |
|---|---|---|---|
| (1) | Step S1 | TDMAP | 1 second |
| (2) | Step S11 | Ar gas | 8 seconds |
| (3) | Step S2 | O$_2$ gas | 6 seconds |
| (4) | Step S12 | Ar gas | 8 seconds |
| (5) | Step S3 | EtCP$_2$Mg | 2.5 seconds |
| (6) | Step S13 | Ar gas | 8 seconds |
| (7) | Step S2 | O$_2$ gas | 6 seconds |
| (8) | Step S14 | Ar gas | 8 seconds |
| (9) | Step S4 | NH$_3$ | 1 second |
| (10) | Step S15 | Ar gas | 8 seconds |

5-2. Example 2

An MgPON film in Example 2 was produced under substantially the same conditions as those used in Example 1 except that the number of repetitive cycles was 999, the degree of vacuum during film formation was lower than that described in Example 1, the flow rate of an ammonia gas was increased, and the step S2 directly after the step S13 and the step S14 were omitted. The MgPON film in Example 2 had the composition Mg$_{3.5}$PO$_{5.9}$N$_{0.45}$.

5-3. XPS Spectra of MgPON Films

FIGS. 3, 4A, 4B, and 5 show XPS spectra of the MgPON films in Examples 1 and 2. An XPS system, Quantera SMX, available from Ulvac-Phi Inc. was used to measure the XPS spectra.

FIG. 3 shows P2p spectra of the MgPON films in Examples 1 and 2 and magnesium phosphate. In FIG. 3, a continuous line represents the P2p spectrum of the MgPON film in Example 1, a dashed line represents the P2p spectrum of the MgPON film in Example 2, and a long-dashed short-dashed line represents the P2p spectrum of magnesium phosphate (Mg$_3$(PO$_4$)$_2$) as a comparative example.

Referring to FIG. 3, each of the P2p spectra of the MgPON films in Examples 1 and 2 exhibits a peak component originating from a P—N bond in addition to a peak component originating from a P—O bond. However, the P2p spectrum of magnesium phosphate exhibits no peak component originating from a P—N bond.

In the MgPON films in Examples 1 and 2, ionic conduction was confirmed as described below. However, it is generally known that magnesium phosphate exhibits no ionic conduction. Therefore, it is inferred that a P—N bond contributes to the ionic conduction of an MgPON film.

FIG. 4A shows O1s spectra of the MgPON films in Examples 1 and 2. In FIG. 4A, a continuous line represents the O1s spectrum of the MgPON film in Example 1 and a dashed line represents the O1s spectrum of the MgPON film in Example 2.

Referring to FIG. 4A, the O1s spectra of the MgPON films in Examples 1 and 2 exhibit a peak component originating from a P—O bond and a peak component originating from an Mg—O bond. In both of the O1s spectra of the MgPON films in Examples 1 and 2, the intensity of the peak component originating from the P—O bond is higher than the intensity of the peak component originating from the Mg—O bond. In the case where each of the O1s spectra of the MgPON films in Examples 1 and 2 is normalized with the intensity of the peak component originating from the P—O bond, the intensity of the peak component originating from the Mg—O bond in the MgPON film in Example 1 is lower than the intensity of the peak component originating from the Mg—O bond in the MgPON film in Example 2.

Figure 4B:
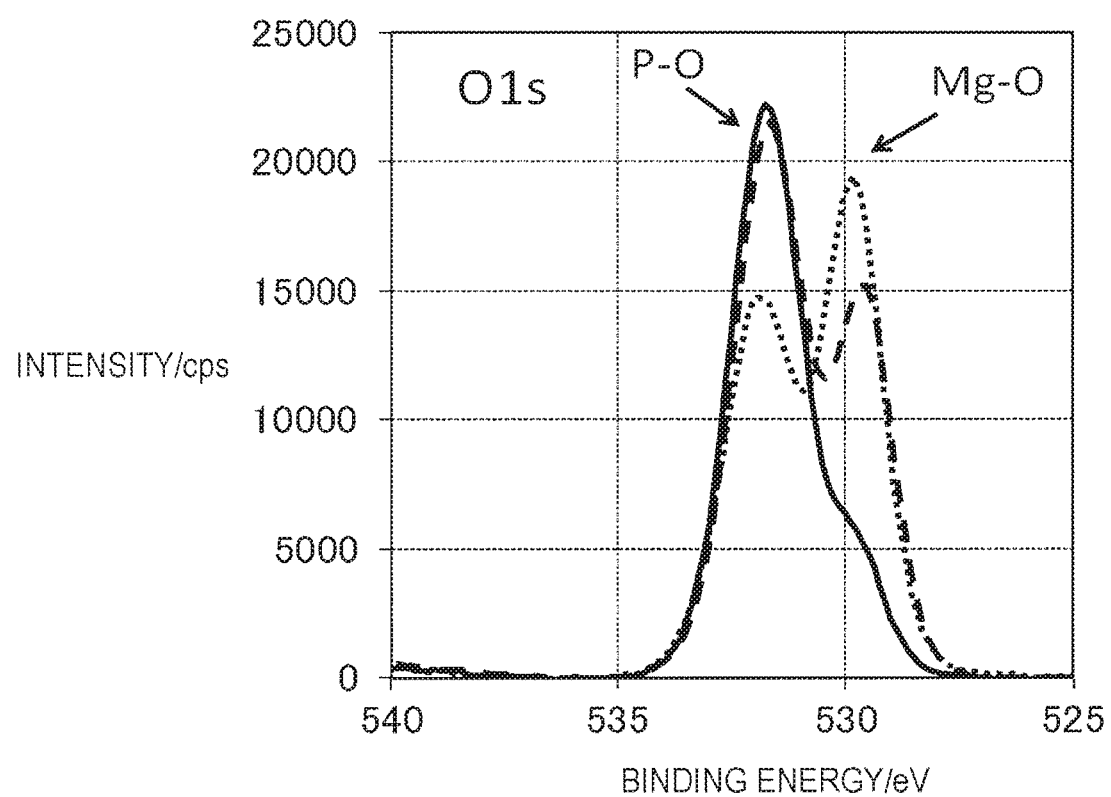
FIG. 4B is a graph showing O1s spectra obtained by measuring a solid electrolyte in Example 3, a solid electrolyte in Example 4, and a solid electrolyte according to a reference example by XPS.

FIG. 4B shows O1s spectra of MgPON films in Examples 3 and 4 and an O1s spectra of an MgPON film in a reference example. In FIG. 4B, a continuous line, a dashed line, and a dotted line represent the O1s spectrum of the MgPON film in Example 3, the O1s spectrum of the MgPON film in Example 4, and the O1s spectra of the MgPON film in a reference example, respectively.

In Examples 3 and 4, the MgPON films were produced under substantially the same conditions as those used in Example 1 except that the flow rate of an ammonia gas was different from that used in Example 1. In particular, the ratio of the flow rate of an ammonia gas to the flow rate of an argon gas used in Example 3 was 50% and the ratio of the flow rate of an ammonia gas to the flow rate of an argon gas used in Example 4 was 30%. In the reference example, the MgPON film was produced under substantially the same conditions as those used in Example 1 except very little amount of an ammonia gas was supplied.

In the O1s spectra of the MgPON films in Examples 3 and 4, the intensity of a peak component originating from a P—O bond is higher than the intensity of a peak component originating from an Mg—O bond as shown in FIG. 4B. The intensity of the peak component originating from the Mg—O bond in the MgPON film in Example 3 is lower than the intensity of the peak component originating from the Mg—O bond in the MgPON film in Example 4. In the O1s spectra of the MgPON film in the reference example, the intensity of a peak component originating from a P—O bond is lower than the intensity of a peak component originating from an Mg—O bond.

These results show that increasing the flow rate of an ammonia gas enables a peak component originating from an Mg—O bond to be reduced. The ratio of the flow rate of the ammonia gas and/or gas serving as a nitrogen supply source to the flow rate of an inert gas (for example, an argon gas) may be set to, for example, 30% or more. This allows the intensity of a peak component originating from a P—O bond to be higher than the intensity of the peak component originating from the Mg—O bond. The relative reduction in intensity of the peak component originating from the Mg—O bond enables the proportion of magnesium, contributing to ionic conduction, in a film to be increased.

Figure 5:
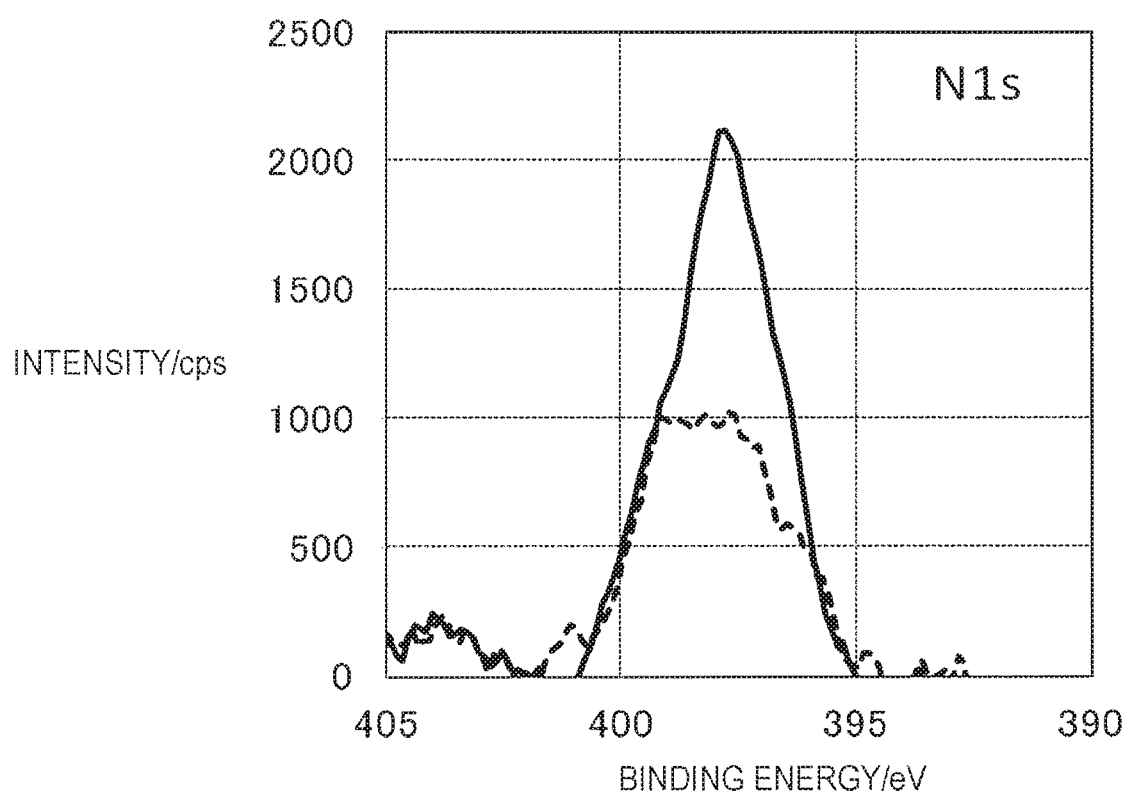
FIG. 5 is a graph showing N1s spectra obtained by measuring the solid electrolytes in Examples 1 and 2 by XPS.

FIG. 5 shows N1s spectra of the MgPON films in Examples 1 and 2. In FIG. 5, a continuous line represents the N1s spectrum of the MgPON film in Example 1 and a dashed line represents the N1s spectrum of the MgPON film in Example 2.

In the N1s spectra of the MgPON films in Examples 1 and 2, a value at about 397.9 eV is greater than a value at about 399.4 eV as shown in FIG. 5. That is, in the N1s spectra of the MgPON films in Examples 1 and 2, a peak component originating from doubly coordinated nitrogen is larger than a peak component originating from triply coordinated nitrogen. Furthermore, the difference between the peak component originating from doubly coordinated nitrogen and the peak component originating from triply coordinated nitrogen in the N1s spectrum of the MgPON film in Example 1 is larger than the difference between those in Example 2. This is probably due to the influence of the degree of vacuum during film formation.

5-4. Measurement of Ionic Conductivity

The MgPON films in Examples 1 and 2 were measured for ionic conductivity using an electrochemical measurement system, Modulab, Solartron Analytical Inc.

Figure 6:
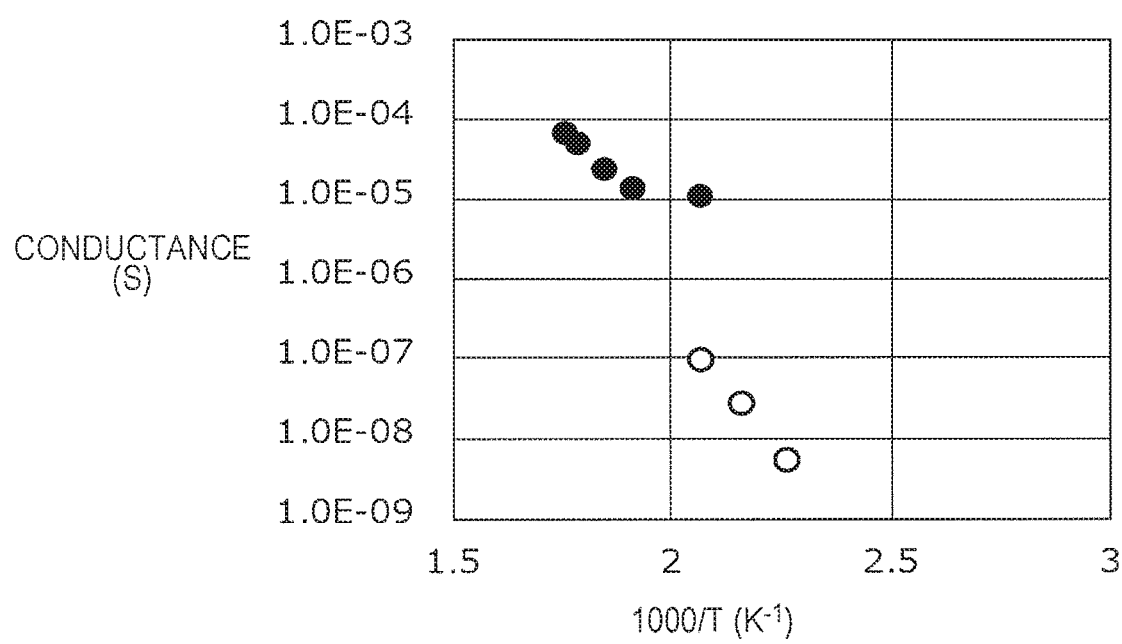
FIG. 6 is a graph showing the temperature dependence of the ionic conductivity of the solid electrolytes in Examples 1 and 2.

FIG. 6 shows the temperature dependence of the ionic conductivity of the MgPON films in Examples 1 and 2. Solid circles represent the measurement results of the MgPON film in Example 1 and open circles represent the measurement results of the MgPON film in Example 2. As shown in FIG. 6, the ionic conductivity of the MgPON film in Example 1 is higher than that in Example 2. The reason for this is inferred as below. First, the peak component originating from the P—N bond in the P2p spectrum of the MgPON film in Example 1 is larger than that in Example 2. This shows that in the MgPON film in Example 1, nitrogen is more appropriately bonded to phosphorus. Therefore, the MgPON film in Example 1 probably has a structure which is likely to conduct magnesium ions. Second, the peak component originating from the Mg—O bond in the O1s spectrum of the MgPON film in Example 1 is larger than that in Example 2. This shows that in the MgPON film in Example 1, the amount of impurities such as MgO is small and the amount of Mg, which contributes to ionic conduction, is large. Third, the peak component originating from doubly coordinated nitrogen in the N1s spectrum of the MgPON film in Example 1 is larger than that in Example 2. This also probably contributes to high ionic conductivity.

The activation energy of the MgPON film in Example 1 was 0.645 eV. The activation energy of the MgPON film in Example 2 was 1.34 eV. The activation energy of other solid electrolyte materials containing magnesium is as follows: for example, the activation energy of $MgZr_4(PO_4)_6$ is 1.4 eV and the activation energy of $MgHf(WO_4)_3$ is 0.835 eV. Therefore, the MgPON films in Examples 1 and 2, as well as that in the reference example, have a function as a solid electrolyte.

[5-5. Cross-Sectional Shape and Composition Analysis of MgPON Film]

A sample including the MgPON film in Example 1 and a pair of Au electrodes was prepared, followed by applying a direct-current voltage of 1 V between the Au electrodes at 450° C. for 1 week. Thereafter, a cross section of the sample was observed with a transmission electron microscope (TEM), HF 2200, available from Hitachi, Ltd.

Figure 7A:
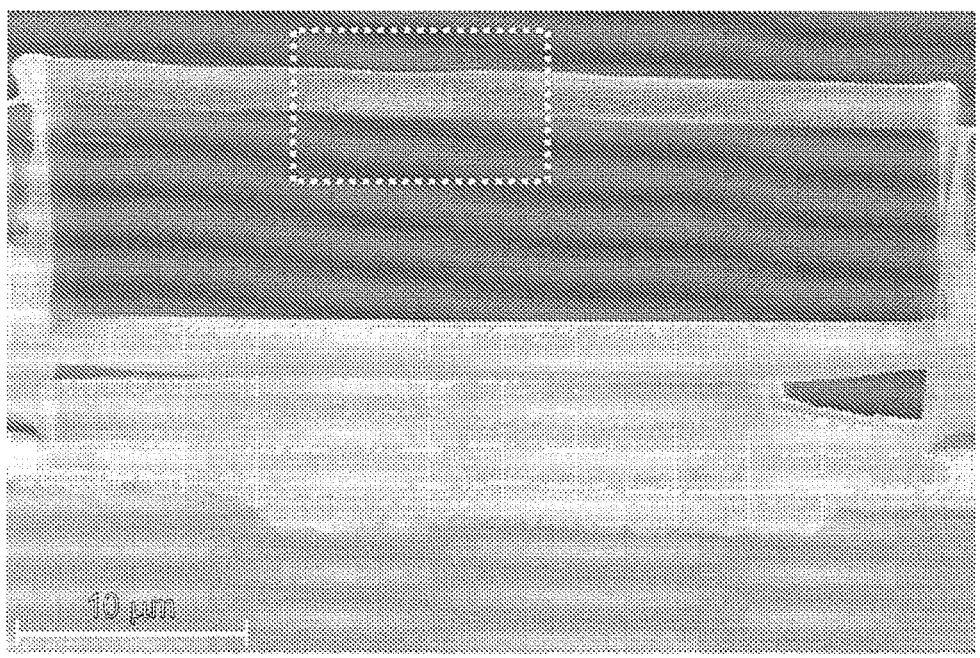
FIG. 7A is an illustration showing a transmission electron microscope (TEM) image of a sample including an MgPON film in Example 1.
Figure 7B:
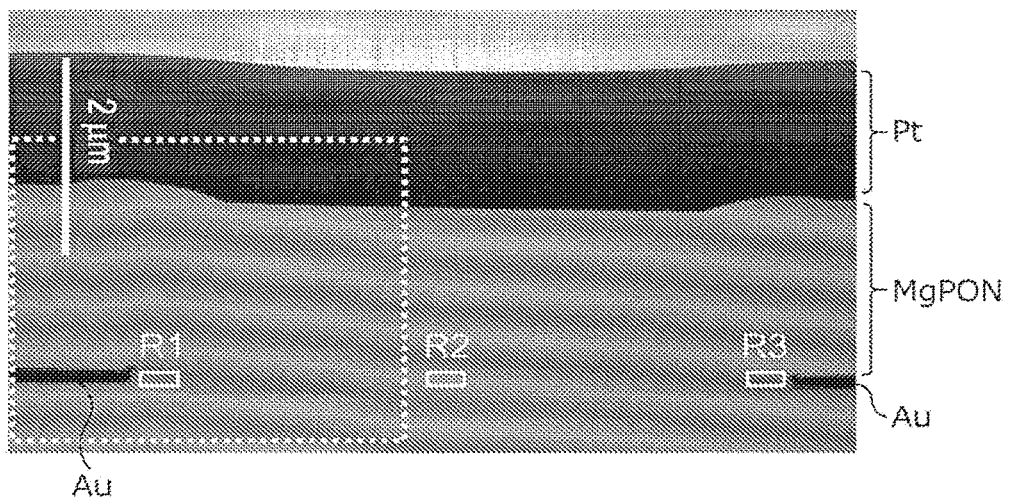
FIG. 7B is an enlarged view of a portion surrounded by a dotted line in FIG. 7A.

FIG. 7A shows a cross-sectional TEM image of the sample. FIG. 7B is an enlarged view of a portion surrounded by a dotted line in FIG. 7A. The thickness of the MgPON film is about 2 μm. FIG. 8A shows an enlarged view of a portion surrounded by a dotted line in FIG. 7B.

Regions R1, R2, and R3 shown in FIG. 7B were analyzed for composition by energy dispersive X-ray spectroscopy (EDS) using an analyzer, NORAN System 7 X-ray Microanalysis System, available from Thermo Fisher Scientific Inc. Each of the regions R1 and R3 was a region near a corresponding one of the Au electrodes. The region R2 was a central region between the Au electrodes. The regions R1, R2, and R3 had a size of 50 nm×500 nm.

Table 2 shows measurement results of the ratio (Mg/P) of magnesium to phosphorus in each region. Each region was measured by EDS three times. The average of obtained measurements is shown in "Mg/P Ave." in Table 2.

TABLE 2

| Region | Mg/P | Mg/P Ave. |
|--------|------|-----------|
| R1 | 1.97 | 1.96 |
|    | 1.96 |      |
|    | 1.93 |      |
| R2 | 1.16 | 1.15 |
|    | 1.11 |      |
|    | 1.18 |      |
| R3 | 1.21 | 1.23 |
|    | 1.27 |      |
|    | 1.21 |      |

Figure 8:
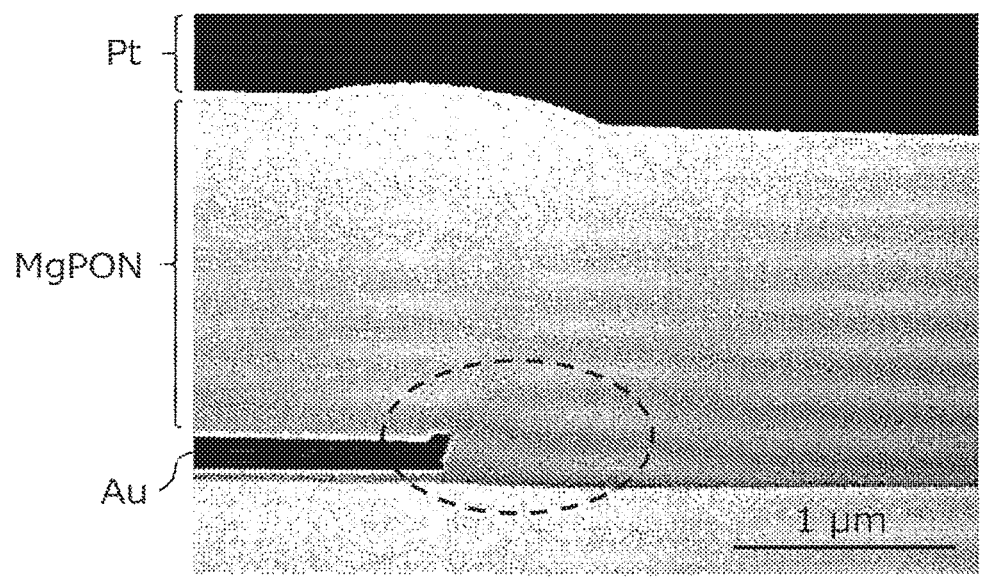
FIG. 8 is an illustration showing an enlarged view of a portion surrounded by a dotted line in FIG. 7B.

As shown in Table 2, the proportion of Mg in the region R1 is high. This shows that Mg is segregated in the region R1. Referring to FIG. 8, a region surrounded by a dashed line corresponds to the region R1 and a peripheral region thereof. In FIG. 8, the region surrounded by the dashed line has lower contrast than that of the surrounding thereof. This shows that Mg is segregated in this region.

The MgPON film in Example 1 was analyzed for depthwise composition by X-ray photoelectron spectroscopy (XPS) separately from EDS analysis. In particular, the MgPON film was measured for element concentration profile in the depth direction of the MgPON film using an X-ray photoelectron spectrometer, Quantera SXM, available from Ulvac-Phi Inc. in such a manner that the XPS measurement of the MgPON film and the sputtering of the MgPON film with Ar were alternately repeated. As a result of measurement, the ratio of magnesium to phosphorus in the MgPON film in Example 1 was 2.0. Differences between measurement results by EDS and measurement results by XPS are due to the difference between measurement methods. In either case, the ratio of magnesium to phosphorus in the MgPON film in Example 1 was 1.5 or more.

What is claimed is:

1. A solid electrolyte including an oxynitride that contains magnesium, phosphorus, oxygen, and nitrogen,
    wherein a molar ratio of the magnesium to the phosphorus is higher than a molar ratio of the nitrogen to the phosphorus,
    a P2p spectrum obtained by an X-ray photoelectron spectroscopy measurement of the oxynitride contains a peak component originating from a P—N bond, and
    the oxynitride has magnesium ion conductivity.

2. The solid electrolyte according to claim 1, wherein the oxynitride is magnesium phosphorus oxynitride.

3. A solid electrolyte including an oxynitride that contains magnesium, phosphorus, oxygen, and nitrogen,
    wherein a molar ratio of the magnesium to the phosphorus is higher than a molar ratio of the nitrogen to the phosphorus, and
    a P2p spectrum obtained by an X-ray photoelectron spectroscopy measurement of the oxynitride contains a peak component originating from a P—N bond,
    the solid electrolyte further including MgO.

4. The solid electrolyte according to claim 1, wherein a molar ratio of the oxygen to the phosphorus is higher than the molar ratio of the magnesium to the phosphorus.

5. The solid electrolyte according to claim 1, wherein the molar ratio of the nitrogen to the phosphorus is equal to or more than 0.2 and less than 1.

6. The solid electrolyte according to claim 1, wherein the molar ratio of the magnesium to the phosphorus is equal to or more than 1.5.

7. The solid electrolyte according to claim 1, wherein the molar ratio of the magnesium to the phosphorus is equal to or more than 1.11 and equal to or less than 1.97.

8. The solid electrolyte according to claim 1,
wherein an O1s spectrum obtained by the X-ray photoelectron spectroscopy measurement of the oxynitride contains a first peak component originating from a P—O bond and a second peak component originating from an Mg—O bond.

9. The solid electrolyte according to claim 1,
wherein an N1s spectrum obtained by the X-ray photoelectron spectroscopy measurement of the oxynitride contains a first peak component originating from triply coordinated nitrogen and a second peak component originating from doubly coordinated nitrogen, and
an intensity of the second peak component is higher than or equal to an intensity of the first peak component.

10. The solid electrolyte according to claim 1, wherein, in the P2p spectrum, an intensity of the peak component originating from the P—N bond is 0.1% or more of an intensity of a peak component originating from a P—O bond.

11. A secondary battery comprising:
a positive electrode;
a negative electrode; and
a solid electrolyte including an oxynitride that contains magnesium, phosphorus, oxygen, and nitrogen,
wherein a molar ratio of the magnesium to the phosphorus is higher than a molar ratio of the nitrogen to the phosphorus,
a P2p spectrum obtained by an X-ray photoelectron spectroscopy measurement of the oxynitride contains a peak component originating from a P—N bond,
the positive electrode contains active material particles, and
the solid electrolyte presents as coating films covering the respective active material particles.

12. The secondary battery according to claim 11, wherein the solid electrolyte presents as a film disposed between the positive electrode and the negative electrode.

13. The secondary battery according to claim 11,
wherein the positive electrode has an irregular surface, and
the film is in direct contact with the irregular surface while following a shape of the irregular surface.

14. The secondary battery according to claim 11,
wherein the negative electrode has an irregular surface, and
the film is in direct contact with the irregular surface while following a shape of the irregular surface.

15. The secondary battery according to claim 11,
wherein the negative electrode contains active material particles, and
the solid electrolyte presents as coating films covering the respective active material particles.

16. The secondary battery according to claim 11, further comprising:
a liquid electrolyte containing magnesium salt.

17. A device comprising:
a first electrode;
a second electrode; and
the solid electrolyte according to claim 1, that extends from the first electrode to the second electrode, wherein
the solid electrolyte includes a first region close to the first electrode, a second region at a center between the first electrode and the second electrode, and a third region close to the second electrode, and
the molar ratio of the magnesium to the phosphorus in the first region is higher than those in the second region and in the third region.

* * * * *